(12) United States Patent
Tao et al.

(10) Patent No.: US 9,030,604 B2
(45) Date of Patent: May 12, 2015

(54) HOUSING FOR WAFER-LEVEL CAMERA MODULE

(71) Applicant: OmniVision Technologies (Shanghai) Co., Ltd., Shanghai (CN)

(72) Inventors: Ye Tao, Shanghai (CN); Wei Yuan, Shanghai (CN); Bo Jiang, Shanghai (JP)

(73) Assignee: OmniVision Technologies (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 14/024,513

(22) Filed: Sep. 11, 2013

(65) Prior Publication Data

US 2014/0078387 A1   Mar. 20, 2014

(30) Foreign Application Priority Data

Sep. 14, 2012   (CN) ...................... 2012 2 0471883 U

(51) Int. Cl.
  *H04N 5/225*   (2006.01)
  *H04N 3/14*   (2006.01)
  *H05K 1/11*   (2006.01)
  *H05K 3/34*   (2006.01)
  *H05K 3/30*   (2006.01)

(52) U.S. Cl.
  CPC ............. *H04N 5/2253* (2013.01); *H05K 1/111* (2013.01); *H05K 3/301* (2013.01); *H05K 3/3436* (2013.01); *H05K 2201/10121* (2013.01); *H05K 2201/10151* (2013.01); *H05K 2201/10969* (2013.01); *H04N 5/2252* (2013.01); *H04N 5/2257* (2013.01)

(58) Field of Classification Search
  CPC ....... H04N 3/155; H04N 5/378; H04N 5/335; H04N 5/374; H04N 9/045; H04N 5/2253; H04N 5/2254; H04N 5/2251; H04N 5/2257; H04N 2101/00; H04N 5/2252; H04N 5/23293; H04N 5/232; H01L 27/14643; H01L 27/14609
  USPC .................................. 348/294–308, 374, 375
  See application file for complete search history.

(56) References Cited

U.S. PATENT DOCUMENTS

| | | | |
|---|---|---|---|
| 2011/0032416 A1* | 2/2011 | Naito et al. | 348/374 |
| 2011/0317065 A1* | 12/2011 | Lin et al. | 348/373 |
| 2012/0140101 A1* | 6/2012 | Afshari et al. | 348/308 |

* cited by examiner

*Primary Examiner* — Tuan Ho
*Assistant Examiner* — Selam Gebriel
(74) *Attorney, Agent, or Firm* — Blakely Sokoloff Taylor & Zafman

(57) ABSTRACT

A housing for protecting a wafer-level camera module and fixing the wafer-level camera module to a printed circuit board (PCB) includes: four side plates, defining a quadrilateral frame; four supporting plates each fixed to a lower portion of an inner face of a corresponding one of the four side plates, each supporting plate having a top face supporting a portion of the camera module; and four bottom plates each fixed to a lower portion of an outer face of a corresponding one of the four side plates, each bottom plate having a bottom face fixed to the PCB. The housing is capable of addressing the issues of poor housing-PCB soldering, paint falling off and surface scratching and improving the efficiency in UV lamp-utilized UV adhesive curing.

13 Claims, 5 Drawing Sheets

HOUSING FOR WAFER-LEVEL CAMERA MODULE

CROSS-REFERENCES TO RELATED APPLICATIONS

This application claims the priority of Chinese patent application number 201220471883.0, filed on Sep. 14, 2012, the entire contents of which are incorporated herein by reference.

TECHNICAL FIELD

The present invention relates to semiconductor packaging technology, and more particularly to a housing for protecting a wafer-level camera module.

BACKGROUND

Digital cameras have been widely used in a variety of applications. With the advent of some new applications, such as cellular phones, vehicles and security and medical appliances, digital cameras are miniaturized to be adapted for easy mounting. Accordingly, camera module, a component of digital cameras, is required to have low manufacturing cost and small horizontal and vertical occupation areas for its suitability for many applications. Such camera modules may be manufactured on a single wafer by using wafer-level technology and packaging technology, and then the wafer-level camera modules are singulated into individual camera modules.

FIG. 1 shows a conventional metal housing of a camera module. The housing includes a quadrilateral top plate 102 and four side plates 108. The top plate 102 is adapted to protect a camera module 120. Referring to FIG. 2, the camera module further includes a sensor 122 and a lens 124 that is disposed on the sensor 122. The top plate 102 includes a light through hole 104 which allows incident light to pass through and reach the lens 124 of the camera module 120. The light through hole 104 is covered with a film (not shown) for protecting the camera module from possible damages in subsequent processes. The side plates 108 are fixed to four sides of the quadrilateral top plate 102, respectively, and each of them includes an opening 110 and a supporting leg 112. Out of the four side plates 108, oppositely disposed two have their openings that are larger than those of the other two which are also disposed opposite to each other. The metal housing is attached to the camera module 120 by ultraviolet (UV) adhesive dispensed through the openings 110. Moreover, as shown in FIG. 3, the supporting legs 112 of the metal housing are soldered to solder balls 114 (not shown) attached to a bonding pad of a printed circuit board (PCB).

The above described design suffers from various deficiencies. One deficiency is that the metal housing is separated from the camera module by a great spacing in all three dimensions, and especially in the Z direction (along the height of the metal housing). The great spacings are highly prone to lead to positional deviations between the metal housing and the camera module during the packaging process and therefore further to a poor packaging precision between the solder balls of the PCB and the metal housing with the camera module packaged therein. This will cause cold solder joint between the metal housing and a printed circuit board assembly (PCBA) during the surface mount technology (SMT) process. Moreover, the cold solder joint will harm the reliability of the resulting housing after the assembled metal housing and camera module were soldered to the PCB.

Another deficiency is that the great spacing between the metal housing and the camera module in the Z direction, coupled with the existence of tolerances of their heights in the same direction, may cause the occurrence of inclination between the metal housing and the camera module during the process of assembling them together when the metal housing is not sufficiently fixed in the Z direction by the UV adhesive dispensed through the openings 110.

In addition, still another deficiency is that openings of the two side plates 108 with larger openings (e.g., the two side plates 108 opposite to each other in the Y direction, i.e., along the length of the metal housing) expose signal pick-up electrodes disposed on side faces of the sensor of the camera module, leaving the camera module unprotected in the Y direction throughout the subsequent assembly processes. Considering that bumps cannot yet be totally prevented in the current manufacturing technology, once a bump occurs, the exposed signal pick-up electrodes disposed on the sensor which are not protected by the metal housing in the Y direction are very likely to be cracked, which will lead to product failure and defects. Thus, as the sensor 122 of the conventional camera module 120 with the metal housing is unprotected in the Y direction, it is vulnerable to impact in this direction.

Moreover, still yet another deficiency is that the great spacings between the metal housing and the camera module in the X and Y directions (i.e., along the width and the length of the metal housing, respectively) may cause deviations in alignment to a center of the light through hole 104 during the process of assembling the metal housing and the camera module together. This may lead to inaccurate alignment between the light through hole 104 and the lens 124.

Furthermore, as there is a great color difference between the metal housing and the lens 124, the metal housing is generally painted to make the outer surface color of the quadrilateral top plate 102 same with that of the lens 124. However, outer surface of the quadrilateral top plate 102 may be scratched by a clip which is used in the assembly process to pick up the metal housing and place it to cover the camera module. Moreover, removal of the film covering the light through hole 104 after the completion of all subsequent processes may also lead to local loss (falling off) of paint applied on surface of the metal housing and hence harm its appearance.

Still yet another deficiency is that although UV adhesive can be conveniently dispensed through any of the four side plate openings 108, in order to cure the dispensed UV adhesive, this design generally requires moving a point light source individually close to each opening. This practice is inefficient.

SUMMARY OF THE INVENTION

The present invention seeks to address the prior art deficiencies discussed above by presenting a modified housing for a wafer-level camera module.

To this end, the present invention provides a housing for protecting a wafer-level camera module and fixing the wafer-level camera module to a PCB. The housing includes: four side plates, defining a quadrilateral frame; four supporting plates each fixed to a lower portion of an inner face of a corresponding one of the four side plates, each supporting plate having a top face supporting a portion of the camera module; and four bottom plates each fixed to a lower portion of an outer face of a corresponding one of the four side plates, each bottom plate having a bottom face fixed to the PCB.

Preferably, the housing may have a length of 2.0 mm to 7.0 mm, a width of 2.0 mm to 7.0 mm and a height of 1.0 mm to 3.0 mm.

Further, each supporting plate may have a length smaller than a length of the lower portion of the corresponding side plate to which the supporting plate is fixed, and wherein each of the four supporting plates is arranged at a same end of the lower portion of the inner face of the corresponding side plate.

Preferably, each supporting plate may have a length of 1.0 mm to 3.0 mm and a width of 0.2 mm to 0.6 mm.

Further, each bottom plate may have a length smaller than a length of the lower portion of the corresponding side plate to which the bottom plate is fixed, and wherein each of the four bottom plates is arranged at a same end of the lower portion of the outer face of the corresponding side plate.

Preferably, each bottom plate may have a length of 1.0 mm to 3.0 mm and a width of 0.2 mm to 0.6 mm.

Further, the PCB may be provided with bonding pads corresponding to the bottom plates.

Preferably, the housing may be formed of a material selected from the group consisting of copper-nickel-zinc alloy, brass and stainless steel.

Preferably, each of the side plates, supporting plates and bottom plates may have a thickness of 0.06 mm to 0.1 mm.

Further, the camera module may include a lens and a sensor, and the lens is disposed on surface of the sensor.

Further, soldering points for being coupled to the supporting plates may be arranged on a bottom face of the lens of the camera module.

Further, the camera module may be fixed to the inner faces of the side plates by an adhesive.

Preferably, the adhesive may be ultraviolet adhesive.

In light of the above description, assembly between the housing and the camera module can be achieved by fixing the four supporting plates to lower portions of inner faces of the respective side plates, forming the quadrilateral frame with the four side plates and placing the camera module on the four supporting plates. Moreover, it can be achieved to assemble the assembly of the housing and the camera module to the PCB by fixing the bottom plates to lower portions of outer faces of the respective side plates and then the bottom plates to the PCB.

With such design, the four supporting plates of the housing are in direct contact with the camera module in the Z direction without any spacing left therebetweeen and the housing is separated from the camera module only in the X and Y directions. Accordingly, the housing and the camera module can be assembled with an improved accuracy.

Substitution of the supporting legs of the prior art which lead to a great spacing between the housing and soldering balls on the PCB for the sheet-shaped bottom plates reduces the spacing and thereby improves distance accuracy between the housing and PCB soldering balls. This can address the poor soldering problem between the housing and the PCBA in the subsequent SMT process and hence improves the reliability of the resulting housing after the assembly of the housing and the wafer-level camera module is soldered onto the PCB.

Additionally, as there is no spacing between the housing and the camera module in the Z direction, when an adhesive is dispensed into the open spaces between the side plates and the camera module, no issue of inclination between the housing and the camera module will arise in the process of assembling.

Moreover, the four side plates of the housing not only protect the camera module in the X direction, but also protect circuitry on the sensor of the camera module in the Y direction, thereby increasing impact resistance of the sensor in the Y direction.

In addition, the housing is a half-enclosure without a top closing plate, which exposes the camera module from the top. Accordingly, the lens of the camera module may receive incident light directly. This addresses the prior art issue of alignment inaccuracy between the center of the light through hole of the metal housing and the lens of the camera module.

Furthermore, non-adoption of shielding elements for the camera module 300 addresses the prior art issue of color difference between the metal housing and the lens of the camera module. It eliminates the necessity of painting the housing and protecting a central portion of the camera module lens with a film and therefore prevents the paint falling off and surface scratching issues that may occur in the assembly between the housing and the camera module.

Furthermore, a UV lamp can be held over the open spaces between the assembled housing and camera module to more efficiently cure adhesive dispensed in the spaces at the same time rather than in an individual manner. Separately, the house of the present invention has a simple structure which results in assembly cost reduction.

DETAILED DESCRIPTION OF THE INVENTION

The above and other objectives, features and advantages of the invention will be readily apparent upon reading of following detailed description on exemplary embodiments with reference to the accompanying drawings.

Numerous specific details are set forth in the following description to provide a thorough understanding of the present invention. It will be apparent to those skilled in this art that the invention may be embodied in many different forms from the exemplary ones described hereunder and that various variants of the exemplary embodiments may be made without departing from the present teachings. Thus, the exemplary embodiments should not be construed to limit the scope of the invention.

Figure 1:
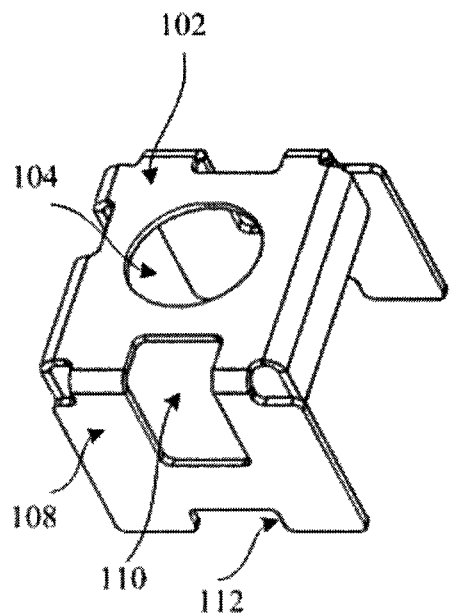
FIG. 1 shows a schematic illustration of a conventional metal housing.
Figure 2:
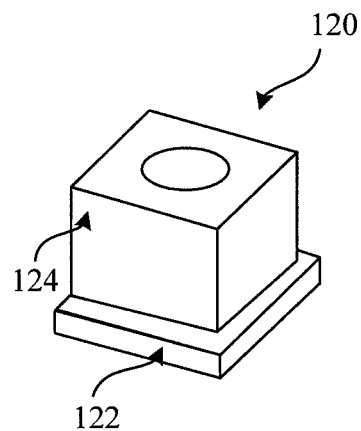
FIG. 2 shows a schematic illustration of a camera module suited to be protected by the metal housing of FIG. 1.
Figure 3:
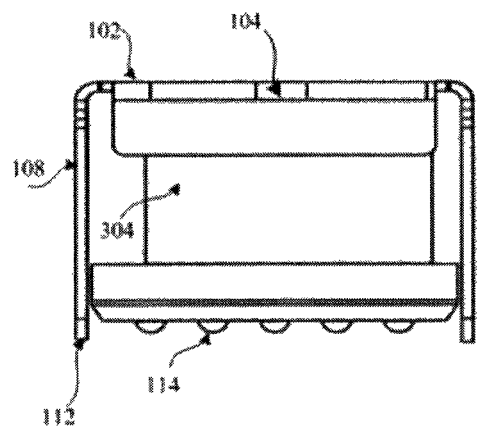
FIG. 3 shows a schematic illustration of the metal housing of FIG. 1 after it has been assembled with a camera module.
Figure 4:
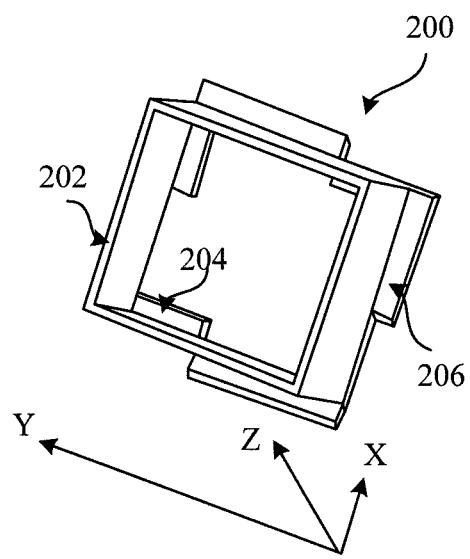
FIG. 4 shows a schematic illustration depicting a housing for protecting a wafer-level camera module in accordance with one embodiment of the present invention.
Figure 5:
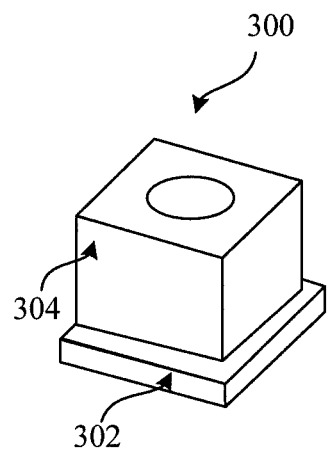
FIG. 5 shows a schematic illustration of a camera module suited to be protected in accordance with one embodiment of the present invention.

FIG. 4 shows a schematic illustration showing a housing embodying the present invention for protecting a wafer-level camera module. The housing is also configured to fix the wafer-level camera module on a PCB. The housing includes four side plates 202, four supporting plates 204 and four bottom plates 206. Four side plates 202 form a quadrilateral frame. Preferably, the quadrilateral frame may have a rectangular shape. A camera module 300 may be attached to inner side faces of the quadrilateral frame with an adhesive. As shown in FIG. 5, the camera module may include a sensor 302 and a lens 304, and the lens 304 is disposed on surface of the sensor 302. Each supporting plate 204 is fixed to a lower portion of the inner face of a corresponding side plate 202, and a top face of the supporting plate 204 supports a portion of the camera module 300. Each bottom plate 206 is fixed to a lower portion of an outer face of a corresponding side plate 202, and a bottom face of the bottom plate 206 is fixed to the PCB.

Preferably, the housing may have a length (along the X direction) of 2.0 mm to 7.0 mm, a width (along the Y direction) of 2.0 mm to 7.0 mm and a height (along the Z direction) of 1.0 mm to 3.0 mm. In a best mode, with reference to FIG. 7 demonstrating the dimensions of the housing in the X and Y directions and FIG. 8 demonstrating the dimension of the housing in the Z direction, the housing has a length of 3.38 mm, a width of 3.83 mm and a height of 1.23 mm.

Figure 7:
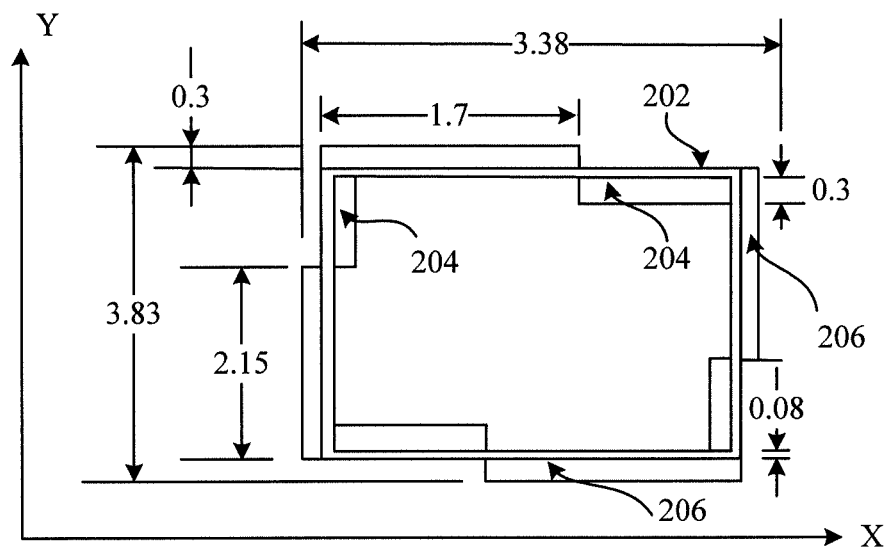
FIG. 7 schematically illustrates the dimensions of a completed wafer-level camera module protection housing in the X and Y directions in accordance with one embodiment of the present invention.
Figure 8:
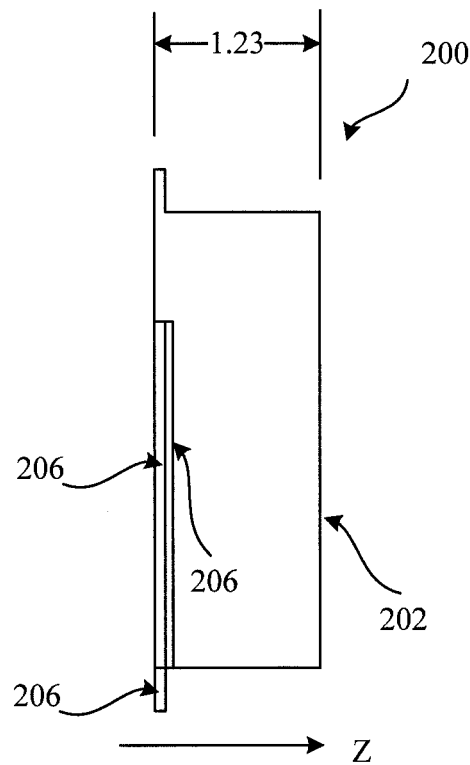
FIG. 8 schematically illustrates the dimension of a completed wafer-level camera module protection housing in the Z direction in accordance with one embodiment of the present invention.

As can be seen from FIGS. 4 and 7, as there is spacing between the housing and the camera module 300 only in the X and Y directions, it can be assembled to the camera module 300 with reduced inaccuracy.

Figure 6:
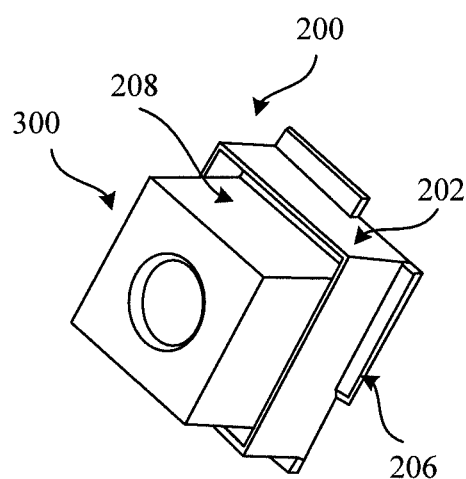
FIG. 6 shows a schematic illustration of a wafer-level camera module protection housing with a camera module assembled therein in accordance with one embodiment of the present invention.

Additionally, there is no spacing between the housing and the camera module 300 in the Z direction. That is, the housing is in direct contact with the camera module 300 at top faces of the four supporting plates 204. Therefore, as shown in FIG. 6, when an adhesive is dispensed into the open space 208 between the quadrilateral frame and the camera module 300, no issue of inclination between the housing and the camera module 300 will arise in the process of assembling them. Preferably, the adhesive may be ultraviolet (UV) adhesive.

In one variant, instead of employing the adhesive, soldering points may be prearranged on a bottom face of the lens 304 of the camera module 300 and soldered to corresponding positions of the four supporting plates 204 with soldering tin applied in advance on the soldering points. This can increase manufacturing efficiency and consistency and result in the integration as a whole of the housing and the PCB in the subsequent SMT process by PCBA soldering.

With further reference to FIG. 4, as the housing includes four side plates 202 and none of them has any opening, the housing can not only protect the camera module 300 in the X direction, but can also protect circuitry on the sensor 302 of the camera module 300 in the Y direction, thereby increasing impact resistance of the sensor 302 in the Y direction. In particular, in the variant described above where the supporting plates 204 of the housing are soldered to the lower portion of the lens 304 of the camera module 300, the protection capability of the housing both in the X and Y directions can provide signal pick-up electrodes arranged on the sensor 302 with the most effective protection.

With continuing reference to FIG. 4, the length of each supporting plate 204 may be smaller than that of a lower side of the corresponding side plate 202 to which the supporting plate 204 is fixed, and all the supporting plates 204 are arranged at a same end, e.g., the left end, of the lower portions of the inner faces of the corresponding side plates 202.

Preferably, each supporting plate 204 may have a length of 1.0 mm to 3.0 mm and a width of 0.2 mm to 0.6 mm. In a best mode, as shown in FIG. 7, each supporting plate 204 has a width of 0.3 mm.

As indicated above, after the four supporting plates 204 and the four side plates 202 that form the quadrilateral frame are assembled together, the camera module 300 may be placed on top faces of the four supporting plates 204. That is, the camera module 300 may be assembled with the four supporting plates 204 and the quadrilateral frame at the bottom, leaving spacings and the open space 208 (as shown in FIG. 6) between the quadrilateral frame and the camera module 300. In such design, the lens 304 of the camera module 300 is directly exposed and therefore can directly receive incident light. This can address the prior art issue of alignment inaccuracy between the center of the light through hole of the metal housing and the lens of the camera module.

Moreover, non-adoption of shielding elements for the camera module 300 addresses the prior art issue of color difference between the metal housing and the lens of the camera module. It eliminates the necessity of painting the housing and protecting a central portion of the camera module lens with a film and therefore prevents the paint falling off and surface scratching issues that may occur in the assembly between the housing and the camera module.

In addition, with further reference to FIG. 6, the four side plates 202 may be fixed to the camera module 300 by dispensing UV adhesive into the open space 208. A UV lamp may be held over the open space 208 to more efficiently cure the UV adhesive at the same time rather than in an individual manner.

With continuing reference to FIG. 4, the length of each bottom plate 206 may be smaller than that of a lower portion of the corresponding side plate 202 to which the bottom plate 206 is fixed, and all the bottom plates 206 are arranged at a same end, e.g., the right end, of the lower portions of the outer faces of the corresponding side plates 202. The bottom plates 206 enable the housing 200 to be fixed on the PCB.

Preferably, each bottom plate 206 may have a length of 1.0 mm to 3.0 mm and a width of 0.2 mm to 0.6 mm. In a best mode, as shown in FIG. 7, each bottom plate 206 oriented along the X direction has a length of 1.7 mm and a width of 0.3 mm, whilst each bottom plate 206 oriented along the Y direction has a length of 2.15 mm and a width of 0.3 mm.

Preferably, the housing 200 may be formed of a material selected from the group consisting of copper-nickel-zinc alloy, brass and stainless steel. In a best mode, the housing 200 is made of copper-nickel-zinc alloy.

Preferably, each above discussed component (i.e., each side, supporting or bottom plate) of the housing 200 may have a thickness of 0.06 mm to 0.1 mm. In a best mode, each component of the housing 200 is made of copper-nickel-zinc alloy and has a thickness of 0.08 mm.

Preferably, the housing 200 may be manufactured by plate press technology.

Preferably, each component of the housing 200 has a thickness of 0.08 mm.

Figure 9:
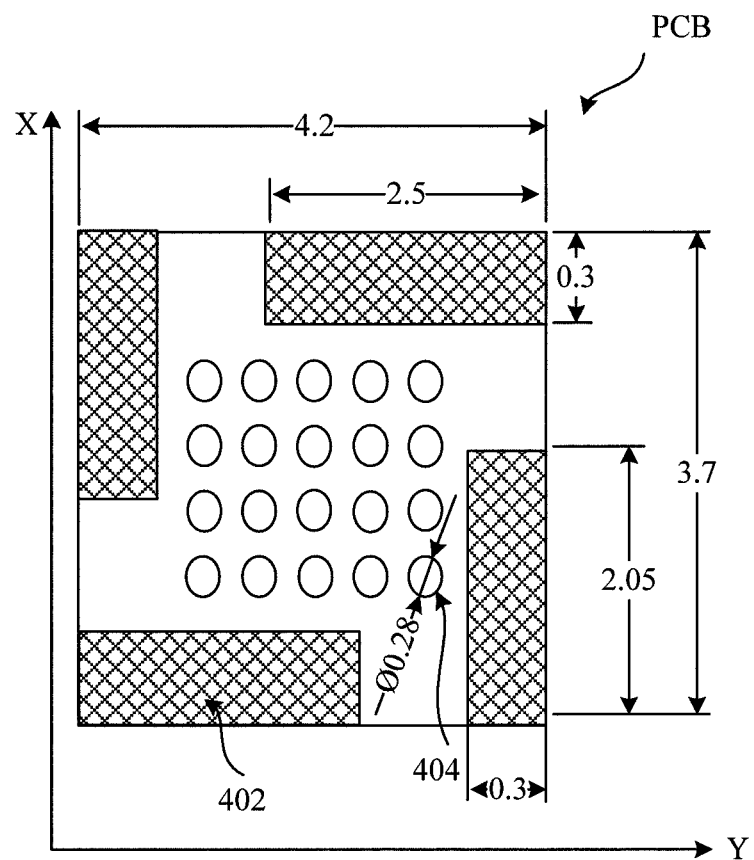
FIG. 9 shows a schematic illustration of a PCB suited to be soldered to a wafer-level camera module protection housing in accordance with one embodiment of the present invention.

Further, referring to FIG. 9, the PCB may be provided with bonding pads 402 corresponding to the bottom plates 206. Moreover, the housing 200 may be fixed to the PCB by soldering the bottom plates 206 to the corresponding bonding pads 402.

Preferably, the PCB may have a length of 2.0 mm to 7.0 mm and a width of 2.0 mm to 7.0 mm. In a best mode, the PCB may have a length of 3.7 mm and a width of 4.2 mm.

Preferably, each bonding pad 402 may have a length of 1.0 mm to 3.0 mm and a width of 0.2 mm to 0.6 mm. In a best mode, each bonding pad 402 oriented along the X direction has a length of 2.05 mm and a width of 0.3 mm, whilst each bonding pad 402 oriented along the Y direction has a length of 2.5 mm and a width of 0.3 mm.

Further, with continuing reference to FIG. 9, the PCB may also be provided with soldering balls 404 configured to lay out sensor circuitry. Preferably, the soldering ball 404 may have a critical dimension (diameter) Ø of 0.2 mm to 0.4 mm. In a best mode, the critical dimension of the soldering balls 404 is 0.28 mm.

The supporting legs 112 of the prior art metal housing lead to a great spacing between housing and soldering balls on the PCB, which is prone to cause great positional deviations between the sensor of the camera module and the soldering balls during the process of soldering the housing to the bonding pads of the PCB. In contrast, employment of the sheet-shaped bottom plates enables the housing of the present invention to reduce its distance to the PCB, thereby improving distance accuracy between the housing and soldering balls of the PCB. This addresses the poor soldering issue between the housing and the PCBA in the subsequent SMT process and hence improves the reliability of the resulting structure after the assembly of the housing and the wafer-level camera module is soldered onto the PCB.

It will be appreciated that the sizes of the components in the best modes are provided solely for describing an approach to obtain an optimum assembly between the housing 200 and the camera module and to thereby better fix the housing onto the PCB and should not be construed as limitations on the scope of the invention.

Compared to the prior art housing that has a fully enclosing structure, the housing of the present invention is a half-enclosure, simple in structure and able to reduce assembly fixture cost. It is capable of achieving the purposes of protecting the camera module and fixing the camera module on the PCB even with the supporting and bottom plates not fully coupled to the side plates.

While preferred embodiments are described and illustrated above, they are not intended to limit the invention in any way. Those skilled in the art can make various modifications and variations without departing from the scope of the invention. Thus, it is intended that the present invention embrace all such modifications and variations as fall within the scope of the appended claims.

What is claimed is:

1. A housing for protecting a wafer-level camera module and fixing the wafer-level camera module to a printed circuit board (PCB), comprising:
   four side plates, defining a quadrilateral frame forming a space within said four side plates;
   four supporting plates each extending into said space from a lower portion of and orthogonal to a corresponding one of the four side plates, a top face of each of the four supporting plates configured to support a portion of the camera module; and
   four bottom plates each extending outside said space from the lower portion of and orthogonal to a corresponding one of the four side plates, a bottom face of each of the four bottom plates configured to be fixed to the PCB.

2. The housing according to claim 1, wherein the housing has a length of 2.0 mm to 7.0 mm, a width of 2.0 mm to 7.0 mm and a height of 1.0 mm to 3.0 mm.

3. The housing according to claim 2, wherein each of the four supporting plates has a length smaller than a length of the lower portion of the corresponding side plate to which the supporting plate is fixed, and wherein each of the four supporting plates is arranged at an inner side of and at a same end of the lower portion of the corresponding side plate.

4. The housing according to claim 3, wherein each of the four supporting plates has a length of 1.0 mm to 3.0 mm and a width of 0.2 mm to 0.6 mm.

5. The housing according to claim 4, wherein each of the four bottom plates has a length smaller than a length of the lower portion of the corresponding side plate to which the bottom plate is fixed, and wherein each of the four bottom plates is arranged at an outer side of and at a same end of the lower portion of the corresponding side plate.

6. The housing according to claim 5, wherein each of the four bottom plates has a length of 1.0 mm to 3.0 mm and a width of 0.2 mm to 0.6 mm.

7. The housing according to claim 1, wherein the PCB is provided with bonding pads corresponding to the bottom plates.

8. The housing according to claim 1, wherein the housing is formed of a material selected from the group consisting of copper-nickel-zinc alloy, brass and stainless steel.

9. The housing according to claim 1, wherein each of the side plates, supporting plates and bottom plates has a thickness of 0.06 mm to 0.1 mm.

10. The housing according to claim 1, wherein the camera module includes a lens and a sensor, and wherein the lens is disposed on surface of the sensor.

11. The housing according to claim 10, wherein soldering points for being coupled to the supporting plates are arranged on a bottom face of the lens of the camera module.

12. The housing according to claim 1, wherein the camera module is fixed to inner faces of the side plates by an adhesive.

13. The housing according to claim 12, wherein the adhesive is ultraviolet adhesive.

* * * * *

UNITED STATES PATENT AND TRADEMARK OFFICE
CERTIFICATE OF CORRECTION

Page 1 of 1

PATENT NO. : 9,030,604 B2
APPLICATION NO. : 14/024513
DATED : May 12, 2015
INVENTOR(S) : Ye Tao, Wei Yuan and Bo Jiang It is certified that error appears in the above-identified patent and that said Letters Patent is hereby corrected as shown below:

On the Title Page, in Item [72], under Inventors, at line 2, delete "(JP)" and insert --(CN)--

Signed and Sealed this
First Day of March, 2016

Michelle K. Lee
*Director of the United States Patent and Trademark Office*